United States Patent
Lee et al.

(10) Patent No.: US 9,316,481 B2
(45) Date of Patent: Apr. 19, 2016

(54) SENSOR FOR MEASURING TILT ANGLE BASED ON ELECTRONIC TEXTILE AND METHOD THEREOF

(71) Applicants: ELECTRONICS AND TELECOMMUNICATIONS RESEARCH INSTITUTE, Daejeon (KR); GEORGIA TECH RESEARCH CORPORATION, Atlanta, GA (US)

(72) Inventors: Hyung Sun Lee, Daejeon (KR); Hyung Cheol Shin, Daejeon (KR); Thad E. Starner, Atlanta, GA (US); Scott M. Gilliland, Atlanta, GA (US); Clint Zeagler, Atlanta, GA (US)

(73) Assignees: ELECTRONICS AND TELECOMMUNICATIONS RESEARCH INSTITUTE, Daejeon (KR); GEORGIA TECH RESEARCH CORPORATION, Atlanta, GA (US)

( * ) Notice: Subject to any disclaimer, the term of this patent is extended or adjusted under 35 U.S.C. 154(b) by 201 days.

(21) Appl. No.: 13/742,012

(22) Filed: Jan. 15, 2013

(65) Prior Publication Data
US 2014/0028291 A1    Jan. 30, 2014

(30) Foreign Application Priority Data
Jul. 26, 2012   (KR) .................. 10-2012-0081653

(51) Int. Cl.
| | | |
|---|---|---|
| G01R 1/06 | (2006.01) | |
| G01B 7/30 | (2006.01) | |
| H01L 21/00 | (2006.01) | |
| B22F 1/00 | (2006.01) | |

(52) U.S. Cl.
CPC ... *G01B 7/30* (2013.01); *B22F 1/00* (2013.01); *H01L 21/00* (2013.01); *H01L 2221/00* (2013.01)

(58) Field of Classification Search
CPC ....... H01L 21/00; H01L 2221/00; B22F 1/00; B22F 2201/00
USPC ................. 324/149, 609, 658, 661, 686, 176
See application file for complete search history.

(56) References Cited

U.S. PATENT DOCUMENTS

| | | | | |
|---|---|---|---|---|
| 3,025,465 A | * | 3/1962 | Breen ........................ | 324/689 |
| 3,185,924 A | * | 5/1965 | Locher ....................... | 324/671 |
| 3,205,334 A | * | 9/1965 | Manwaring ................ | 219/773 |

(Continued)

FOREIGN PATENT DOCUMENTS

KR    10-2011-0104411 A    9/2011

OTHER PUBLICATIONS

Hannah Perner-Wilson et al., "Handcrafting Textile Interfaces from a Kit-of-No-Parts", TEI'11 (Proceedings of the 5th International Conference on Tangible and Embedded Interaction 2011), Jan. 22-26, 2011, pp. 61-68.

*Primary Examiner* — Huy Q Phan
*Assistant Examiner* — Temilade Rhodes-Vivour
(74) *Attorney, Agent, or Firm* — Rabin & Berdo, P.C.

(57) ABSTRACT

Disclosed are a sensor for measuring a tilt angle based on electronic textile according to the present invention and a method thereof. A sensor for measuring a tilt angle based on electronic textile according to the present invention includes a plurality of textile electrodes disposed at predetermined uniform intervals on a textile surface; a textile conductive wire of which one end is connected to a center between the plurality of textile electrodes; and a metal bead connected to another end of the textile conductive wire to thereby be connected to the textile surface.

13 Claims, 4 Drawing Sheets

(56) References Cited

U.S. PATENT DOCUMENTS

| | | | | |
|---|---|---|---|---|
| 2005/0054941 A1* | 3/2005 | Ting | ................... | A61B 5/0408 600/529 |
| 2005/0207172 A1* | 9/2005 | Orth | ................... | H03K 17/962 362/395 |
| 2008/0208063 A1* | 8/2008 | Brauers | .............. | A61B 5/04085 600/481 |
| 2011/0254567 A1* | 10/2011 | Gehrig et al. | ................. | 324/663 |
| 2011/0304955 A1* | 12/2011 | Zhou et al. | ................... | 361/541 |

* cited by examiner

SENSOR FOR MEASURING TILT ANGLE BASED ON ELECTRONIC TEXTILE AND METHOD THEREOF

CROSS-REFERENCE TO RELATED APPLICATIONS

This application claims priority to and the benefit of Korean Patent Application No. 10-2012-0081653 filed in the Korean Intellectual Property Office on Jul. 26, 2012, the entire contents of which are incorporated herein by reference.

TECHNICAL FIELD

The present invention relates to a tilt sensor based on electronic textile, and more particularly, to a sensor for measuring a tilt angle based on electronic textile that connects a metal bead to dangle from a center between a plurality of conductive textile electrodes disposed at uniform intervals using a textile conductive wire and in this instance, connects the textile conductive wire using a twisted pair cable connecting scheme, and a method thereof.

BACKGROUND ART

Electronic textile refers to a system generated by combining conductive textile, a small electronic part, and the like. Here, the conductive textile is generated by applying conductive yarn, conductive ink, and the like to general textile. In a next generation computing research field, research on creating an intelligent object by combining a computing function with an accessory of a textile material such as clothes, bags, or shoes that people wear every day has been actively conducted. Even in the fashion industry, attempts have been made to design a new type of clothes using electronic textile.
A portion of research in the electronic textile field relates to attempts for developing again an existing electronic part that has not been manufactured using a textile material, or mechanical parts using a conductive textile material. Such examples may include a textile button for replacing a mechanical button, a textile-type pressure sensor for replacing a pressure sensor, and the like.
FIGS. 1A, 1B and 1C are diagrams illustrating a tilt sensor proposed by Perner-Wilson according to a related art. As illustrated in FIGS. 1A, and 1B, Perner-Wilson has proposed a tilt sensor shown in a left picture, published in the scholarship conference. The tilt sensor was prepared by disposing six conductive textile electrodes (as shown in FIG. 1A) around a metal bead to be in a circular shape. FIG. 1C is an enlargement showing details of the textile. When the metal bead becomes tilted by inclination, the metal bead becomes in contact with a single electrode (as shown in FIG. 1B) among the above six conductive textile electrodes and thus, it is possible to know an approximate gradient by detecting the contact.
A gradient sensor shown in a right picture proposed by Perner-Wilson was designed to be capable of more consecutively detecting a change in a gradient by employing a potentiometer instead of employing an electrode.
However, the above tilt sensor based on the electronic textile or gradient sensors have many disadvantages. That is, contact occurs only when a metal bead is positioned on the cloth. Therefore, when the metal bead is turned over, it is not possible to know a tilt angle, or there is a need to use two sensors. When a change in a tilt angle occurs in a direction opposite to a direction of a bead, the bead does not move and thus, a malfunction occurs. Since a measurement error of a tilt angle is great, an application field applicable with the tilt sensor constructed as above may be limited.

SUMMARY OF THE INVENTION

The present invention has been made in an effort to provide a sensor for measuring a tilt angle based on electronic textile that connects a metal bead to dangle from a center between a plurality of conductive textile electrodes disposed at uniform intervals using a textile conductive wire and in this instance, connects the textile conductive wire using a twisted pair cable connecting scheme, and a method thereof.
However, objects of the present invention are not limited to the above-described matters and thus, other objects of the present invention not described herein may be clearly understood by those skilled in the art from the following description.
An exemplary embodiment of the present invention provides a sensor for measuring a tilt angle based on electronic textile, including: a plurality of textile electrodes disposed at predetermined uniform intervals on a textile surface; a textile conductive wire of which one end is connected to a center between the plurality of textile electrodes; and a metal bead connected to another end of the textile conductive wire to thereby be connected to the textile surface.
The plurality of textile electrodes may be disposed to be mutually point symmetric based on a point on the textile surface at which the metal bead is connected. The plurality of textile electrodes may be disposed to be at least four so that the number of the plurality of textile electrodes is a multiple of "two".
The textile conductive wire may be formed as a twisted pair cable, one conductive wire constituting the twisted pair cable may be connected to the metal bead, and the other conductive wire may be connected to a point on the textile surface at which the metal bead is connected. The twisted pair cable may be wound so that the other conductive wire may not be overlapped with the one conductive wire based on the one conductive wire.
The sensor for measuring the tilt angle based on the electronic textile may further include a measurement means to calculate a tilt angle of the metal bead using capacitance between each of the two different textile electrodes, disposed to be mutually symmetrical among the plurality of textile electrodes, and the metal bead. The measurement means may measure the capacitance between each of the two different textile electrodes, disposed to be mutually symmetrical among the plurality of textile electrodes, and the metal bead, and may calculate a tilt angle of the metal bead with respect to the two different textile electrodes using the measured capacitance.
When tilt angles of the metal bead with respect to all of the plurality of textile electrodes are calculated, the measurement means may calculate a relative tilt angle of the metal bead with respect to the textile surface using the calculated tilt angles of the metal bead.
The measurement means may measure capacitance of each of the two conductive wires that constitute the textile conductive wire and thereby determine a difference in the measured capacitance between the two conductive wires as capacitance between the textile electrode and the metal bead.
Another exemplary embodiment of the present invention provides a method of measuring a tilt angle using a sensor including a plurality textile electrodes disposed on a textile surface and a metal bead connected to a center between the plurality of textile electrodes through a textile conductive wire, the method including: measuring capacitance between each of the two different textile electrodes, disposed to be mutually symmetric among the plurality of textile electrodes, and the metal bead; calculating a tilt angle of the metal bead with respect to the two different textile electrodes using the measured capacitance and; and calculating a relative tilt angle of the metal bead with respect to the textile surface using the tilt angles of the metal bead calculated with respect to all of the plurality of textile electrodes.

The plurality of textile electrodes may be disposed to be mutually point symmetric based on a point on the textile surface at which the metal bead is connected. The plurality of textile electrodes may be disposed to be at least four so that the number of the plurality of textile electrodes is a multiple of "two".

The textile conductive wire may be formed as a twisted pair cable, one conductive wire constituting the twisted pair cable may be connected to the metal bead, and the other conductive wire may be connected to a point on the textile surface at which the metal bead is connected. The twisted pair cable may be wound so that the other conductive wire may not be overlapped with the one conductive wire based on the one conductive wire.

According to exemplary embodiments of the present invention, by connecting a metal bead to dangle from a center between a plurality of conductive textile electrodes disposed at uniform intervals using a textile conductive wire and in this instance, connecting the textile conductive wire using a twisted pair cable connecting scheme, it is possible to measure a tilt angle at a resolution higher than a resolution of an existing textile tilt sensor.

According to exemplary embodiments of the present invention, by connecting a metal bead to dangle from a center between a plurality of conductive textile electrodes disposed at uniform intervals using a textile conductive wire and in this instance, connecting the textile conductive wire using a twisted pair cable connecting scheme, it is possible to measure a tilt angle even in a state where the metal bead is turned over.

The foregoing summary is illustrative only and is not intended to be in any way limiting. In addition to the illustrative aspects, embodiments, and features described above, further aspects, embodiments, and features will become apparent by reference to the drawings and the following detailed description.

Figure 1A:
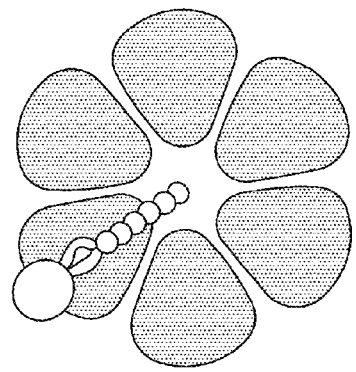
FIGS. 1A, 1B and 1C are diagrams illustrating a tilt sensor proposed by Perner-Wilson according to a related art.
Figure 1B:
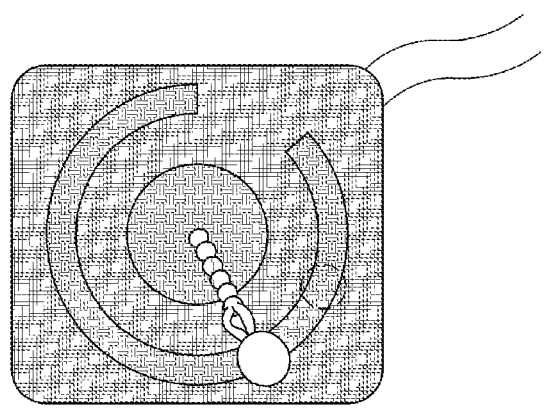
Figure 1C:
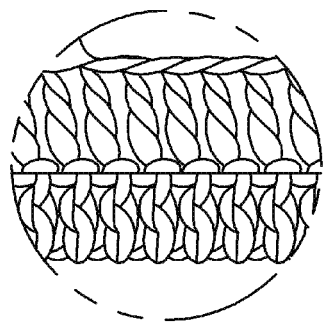

It should be understood that the appended drawings are not necessarily to scale, presenting a somewhat simplified representation of various features illustrative of the basic principles of the invention. The specific design features of the present invention as disclosed herein, including, for example, specific dimensions, orientations, locations, and shapes will be determined in part by the particular intended application and use environment.

In the figures, reference numbers refer to the same or equivalent parts of the present invention throughout the several figures of the drawing.

DETAILED DESCRIPTION

Hereinafter, a sensor for measuring a tilt angle based on electronic textile according to exemplary embodiments of the present invention and a method thereof will be described in detail with reference to the accompanying FIGS. 2 through 6. Description will be made in detail based on a portion required to understand an operation and effect according to the present invention.

In particular, the present invention proposes a new tilt sensor based on electronic textile that connects a metal bead to dangle from a center between a plurality of conductive textile electrodes disposed at uniform intervals using a textile conductive wire and in this instance, connects the textile conductive wire using a twisted pair cable connecting scheme.

Figure 2:
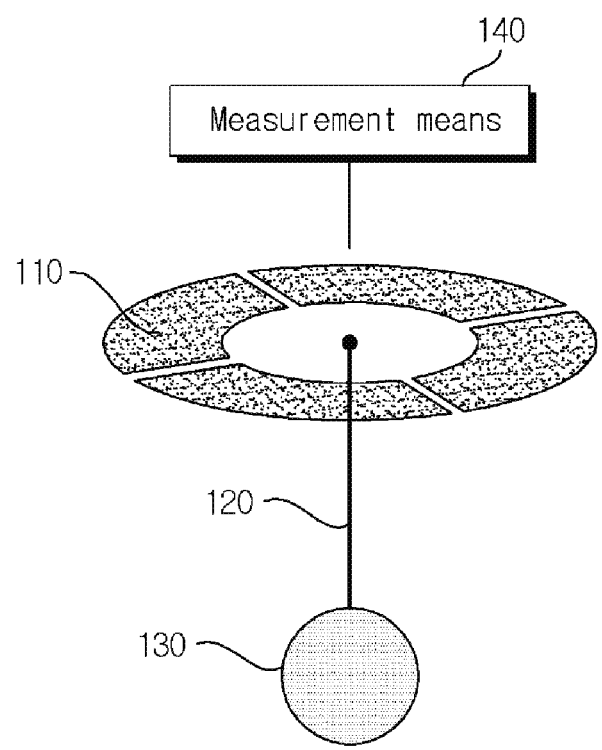
FIG. 2 is a diagram illustrating a tilt sensor based on electronic textile according to an exemplary embodiment of the present invention.

FIG. 2 is a diagram illustrating a tilt sensor based on electronic textile according to an exemplary embodiment of the present invention.

As illustrated in FIG. 2, the tilt sensor based on the electronic textile according to the present invention may include a plurality of textile electrodes 110, a textile conductive wire 120, a metal bead 130, and a measurement means 140.

The plurality of textile electrodes 110 may be disposed at predetermined distances, for example, uniform intervals of 1 centimeter (cm) on textile. For example, at least four textile electrodes 110 may be disposed in a circular shape.

In this instance, the plurality of textile electrodes 110 may be disposed to be at least four, so that the number of the plurality of textile electrodes 110 may be a multiple of "two", for example, four, six, eight, and the like. The metal bead 130 may be connected to a center between the plurality of textile electrodes 110 through the textile conductive wire 120. That is, one end of the textile conductive wire 120 is connected to the center between the plurality of textile electrodes 110 and the other end of the textile conductive wire 120 is connected to the metal bead 130.

In this instance, a distance between a point at which the metal bead 130 is connected to the textile through the textile conductive wire 120 and each of the plurality of textile electrodes 110 may be designed to be proportional to a length of the textile conductive wire 120. A size of each of the plurality of textile electrodes 110 may be designed to be proportional to a size of the metal bead 130.

The measurement means 140 may measure a tilt angle or a gradient of the electronic textile using capacitance between each of the plurality of textile electrodes 110 and the metal bead 130.

Figure 3:
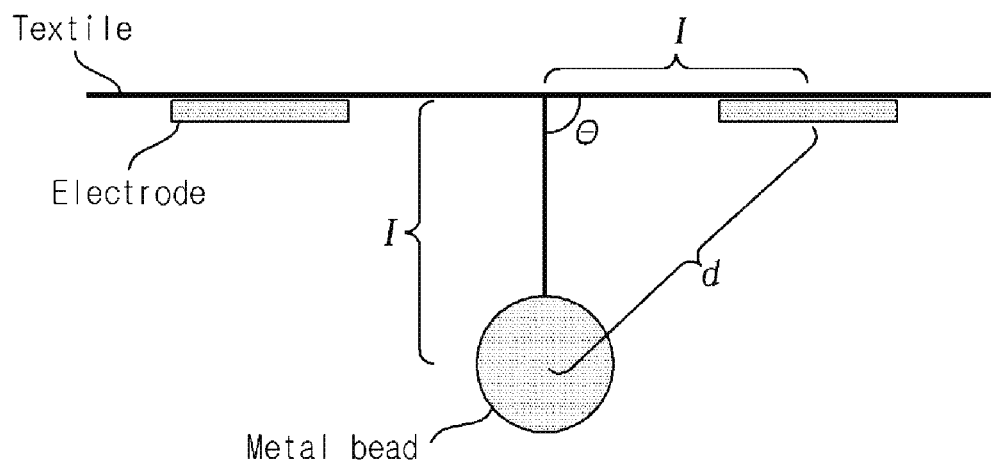
FIG. 3 is a diagram illustrating a simplified geometric structure of the tilt sensor of FIG. 2.

FIG. 3 is a diagram illustrating a simplified geometric structure of the tilt sensor of FIG. 2.

FIG. 3 shows a geometric structure of a tilt sensor according to the present invention. It is assumed that N textile electrodes are disposed to be point symmetric based on a connection point of a metal bead.

In this instance, when a gradient between an x axis of a textile surface and the metal bead is $\theta$ and a gradient between a y axis of the textile surface and the metal bead is $\phi$, the minimum number of conductive textile electrodes required to obtain $\theta$ and $\phi$ is four.

Initially, the measurement means 140 may sequentially measure capacitance C between each textile electrode and the metal bead with respect to N textile electrodes. The capacitance C between each textile electrode and the metal bead may be expressed by the following Equation 1.

$$C = \varepsilon_r \varepsilon_0 \frac{A}{d} \qquad \text{[Equation 1]}$$

Here, A denotes an area of a textile electrode, d denotes a distance between the textile electrode and the metal bead, $\varepsilon_r$ denotes relative permittivity, and $\varepsilon_0$ denotes an electric constant, that is, may be expressed as $\varepsilon_0 \approx 8.854 \times 10^{-12}$ Fm$^{-1}$.

Accordingly, when it is possible to measure and thereby know capacitance between all of the textile electrodes and the metal bead, the measurement means 140 may calculate a relative gradient between the textile electrode and the metal bead from a structural relationship between the textile electrode and the metal bead.

A relationship between the distance d between the textile electrode and the metal bead and the gradient between the x axis of the textile surface and the metal bead, that is, a tilt angle θ of the metal bead may be expressed by the following Equation 2.

$$d = 2l \sin \frac{\theta}{2} \qquad \text{[Equation 2]}$$

Here, l denotes a length of a textile conductive wire connected to the metal bead or a point at which the metal bead is connected to the textile.

When two textile electrodes are assumed as electrodes positioned on the x axis, a relationship between capacitance $C_1$ between the right textile electrode and the metal bead and capacitance $C_3$ between the left textile electrode and the metal bead may be expressed by the following Equation 3.

$$C_3 = \varepsilon_r \varepsilon_0 \frac{A}{2l \sin \frac{\pi - \theta}{2}} = \frac{\varepsilon_r \varepsilon_0 A}{2l} \frac{1}{\sin \frac{\pi}{2} \cos \frac{-\theta}{2} + \cos \frac{\pi}{2} \sin \frac{-\theta}{2}} = \frac{\varepsilon_r \varepsilon_0 A}{2l} \frac{1}{\cos \frac{\theta}{2}} \qquad \text{[Equation 3]}$$

The above equation 3 may be arranged to the following Equation 4.

$$\frac{C_3}{C_1} = \frac{\sin \frac{\theta}{2}}{\cos \frac{\theta}{2}} = \tan \frac{\theta}{2} \qquad \text{[Equation 4]}$$

Using the above Equation 4, the tilt angle θ of the metal bead may be expressed by the following Equation 5.

$$\theta = 2 \times \tan^{-1} \frac{C_3}{C_1} \qquad \text{[Equation 5]}$$

In this instance, the gradient φ between the metal bead and the y axis of the textile surface does not give any affect on a distance between the metal bead and two textile electrodes on the x axis of the textile surface and thus, the above Equation 5 may be utilized to calculate a gradient with the x axis regardless of φ.

Similarly, when capacitance values between the metal bead and the respective two textile electrodes on the y axis of the textile surface are $C_2$ and $C_4$, φ may be obtained using the following Equation 6.

$$\varphi = 2 \times \tan^{-1} \frac{C_4}{C_2} \qquad \text{[Equation 6]}$$

Meanwhile, a conductive wire is affected by a stray capacitance value due to neighboring another conductor. In particular, in the case of an electronic textile tilt sensor, a capacitance value between the metal bead and the textile electrode is significantly small. Therefore, when an arm of a user and the like is present around a sensor, it may cause great noise in a measurement value and thereby make the measured tilt angle meaningless.

In general, a shielding scheme is employed to decrease effect of another conductor. However, even a shielding electrode causes great stray capacitance in a measurement electrode and thus, a measured capacitance value may be beyond the measurement range of a measurement circuit.

The present invention proposes a method of employing a twisted pair cable as a textile conductive wire to solve the above issue that the stray capacitance affects a long capacitance measurement conductive wire.

That is, one conductive wire in the textile twisted pair cable is connected to the metal bead and the other conductive wire is connected to a connection point of the metal bead. By measuring capacitance of each of the above two conductive wires, a difference in the capacitance between the two conductive wires is determined as capacitance desired to be measured.

Two conductive wires are exposed to the same stray capacitance and thus, the difference therebetween includes only a capacitance value between the metal bead and the textile electrode. As described above, the textile twisted pair cable may be applied to the tilt sensor based on electronic textile and to a case in which capacitance measurement is required and a distance between the measurement means and the textile electrode is distant.

Hereinafter, a method of generating a textile twisted pair cable proposed by the present invention will be described.

Figure 4:
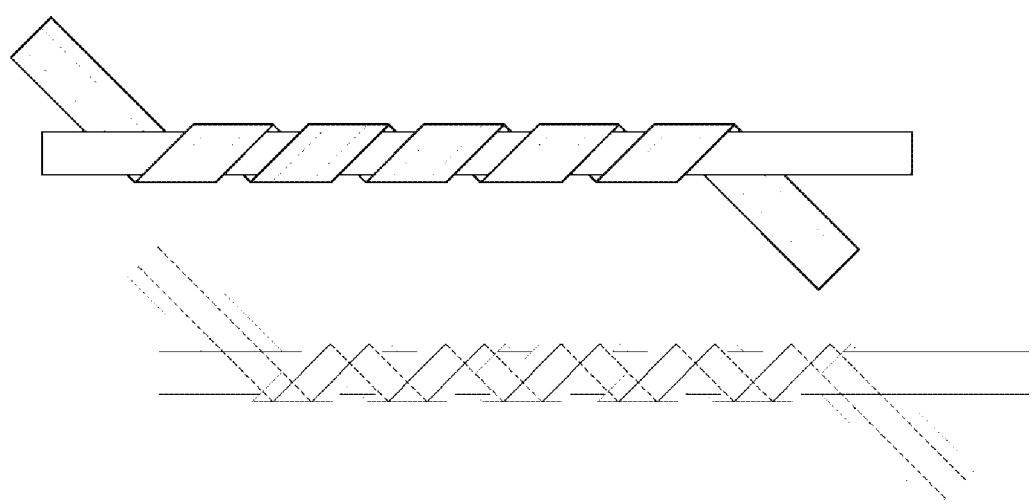
FIG. 4 is a diagram to describe a generation principle of a textile twisted pair cable according to an exemplary embodiment of the present invention.

FIG. 4 is a diagram to describe a generation principle of a textile twisted pair cable according to an exemplary embodiment of the present invention.

As illustrated in FIG. 4, initially, two parallel textile conductive wires may be generated on a thin and long textile piece. A method of generating a textile conductive wire may employ a variety of methods such as sewing using conductive thread, printing using conductive ink, and the like.

An interval between the two textile conductive wires needs to be maintained as an appropriate distance so as not to be shorted while in use.

Next, a thin and long second textile piece having a conductive wire is wound so that the conductive wire may be inwardly received based on a thin and long first textile piece. That is, the second textile piece is wound not to be overlapped with the first textile piece based on the first textile piece.

In this instance, the first textile piece disposed on the center may function as an insulating layer to prevent conductive wires from being shorted.

Next, the wound two pieces of textile are fixed to each other using a method such as sewing and the like.

Figure 5:
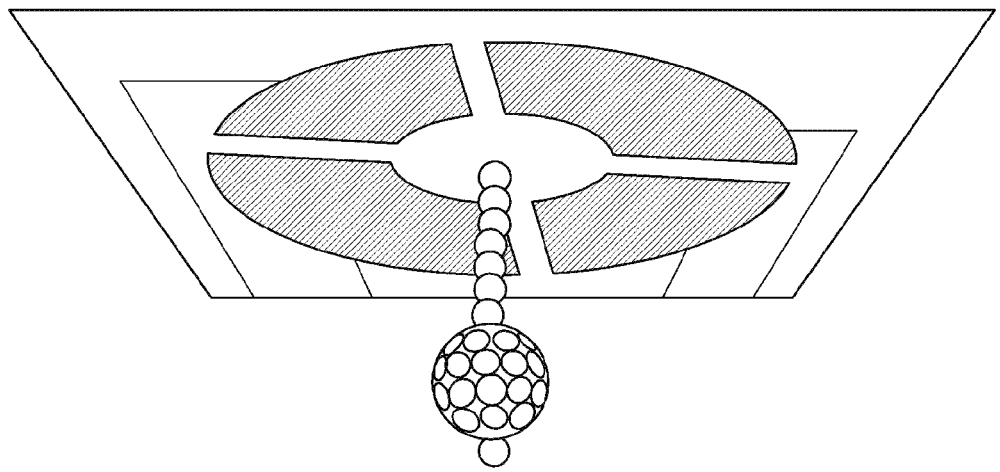
FIG. 5 is a diagram illustrating an actually configured form of a tilt sensor according to an exemplary embodiment of the present invention.

FIG. 5 is a diagram illustrating an actually configured form of a tilt sensor according to an exemplary embodiment of the present invention.

As illustrated in FIG. 5, the tilt sensor is configured by connecting a metal bead with the diameter of about 1 cm and textile to dangle with the length of 3 cm and by sewing four textile electrodes based on a connection point of the metal bead using conductive thread. Each textile electrode is disposed away from a mounted point by minimum 1 cm and is disposed at intervals of 0.5 cm from other neighboring electrodes, and has a shape in which a ring with the thickness of 2 cm and the diameter of 3 cm is divided into four equal parts.

For convenience, a line that connects symmetrically disposed two textile electrodes by employing the mounted point as a starting point is selected as an x axis, and a line that connects remaining two textile electrodes is selected as a y axis. Four textile electrodes may be connected to a measurement means through conductive thread, and the metal bead may be electrically connected to the measurement means using a textile twisted pair cable. AD7746 of Analog Devices Company capable of measuring capacitance at the accuracy of 24 bits is employed to measure capacitance. This integrated circuit chip is mounted to a circuit that is connected with a textile conductive wire continuing from each textile electrode of the tilt sensor based on the electronic textile.

AD7746 may set an operation to make it possible to measure differential capacitance between two nodes. By connecting two conductive wires of the twisted pair cable using differential input of AD7746, and by sequentially applying a stimulus signal to four electrodes, capacitance between the metal bead and each textile electrode is obtained.

Figure 6:
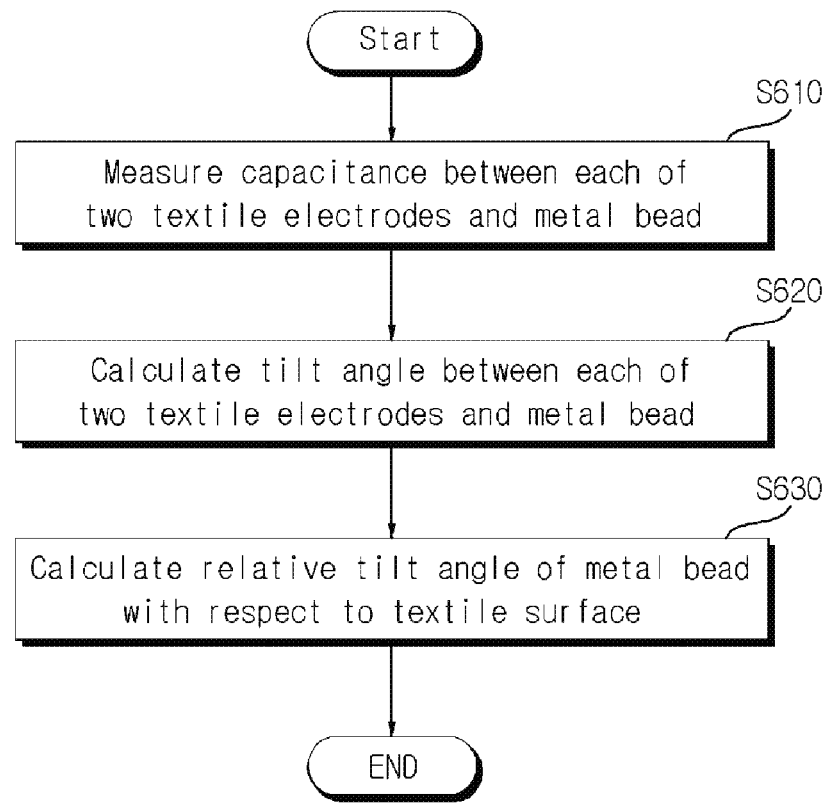
FIG. 6 is a flowchart illustrating a method of measuring a tilt angle according to an exemplary embodiment of the present invention.

FIG. 6 is a flowchart illustrating a method of measuring a tilt angle according to an exemplary embodiment of the present invention.

As illustrated in FIG. 6, a tilt sensor based on electronic textile according to the present invention may measure capacitance between each of two textile electrodes, disposed to be mutually symmetric among a plurality of textile electrodes, and a metal bead (S610).

Next, the tilt sensor based on the electronic textile may determine a tilt angle of the metal bead with respect to two textile electrodes disposed to be mutually symmetric using the measured capacitance (S620).

Next, when the tilt angles of the metal bead with respect to all of the plurality of the textile electrodes are calculated, the tilt sensor based on the electronic textile may calculate a relative tilt angle of the metal bead with respect to a textile surface using the calculated tilt angles of the metal bead with respect to the plurality of textile electrodes (S630).

Meanwhile, even though it is described that all of the constituent elements constituting the aforementioned exemplary embodiments of the present invention are combined into one or are combined with each other and thereby operate, the present invention is not necessarily limited to the exemplary embodiments. That is, without departing from the objects of the present invention, at least one of all of the constituent elements may be selectively combined and thereby operate. Even though each of all of the constituent elements may be configured as single independent hardware, a portion of or all of the constituent elements may be selectively combined and thereby be configured as a computer program having a program module that performs a portion of or all of the combined functions in one or a plurality of hardware. The computer program may be stored in computer-readable media such as a universal serial bus (USB) memory, a CD disk, a flash memory, and the like, and thereby be read and executed by the computer to thereby implement the exemplary embodiments of the present invention. Storage media of the computer program may include magnetic storage media, optical storage media, carrier wave media, and the like.

Unless differently defined in the detailed description, all of the terminologies including technical or scientific terminology have the same meaning as a meaning generally understood by those skilled in the art. Generally used terminologies such as a terminology defined in a dictionary should be interpreted to match a contextual meaning of the related art and, unless clearly defined in the present invention, should not be interpreted as an idealistic or excessively formal meaning.

As described above, the exemplary embodiments have been described and illustrated in the drawings and the specification. The exemplary embodiments were chosen and described in order to explain certain principles of the invention and their practical application, to thereby enable others skilled in the art to make and utilize various exemplary embodiments of the present invention, as well as various alternatives and modifications thereof. As is evident from the foregoing description, certain aspects of the present invention are not limited by the particular details of the examples illustrated herein, and it is therefore contemplated that other modifications and applications, or equivalents thereof, will occur to those skilled in the art. Many changes, modifications, variations and other uses and applications of the present construction will, however, become apparent to those skilled in the art after considering the specification and the accompanying drawings. All such changes, modifications, variations and other uses and applications which do not depart from the spirit and scope of the invention are deemed to be covered by the invention which is limited only by the claims which follow.

What is claimed is:

1. A sensor for measuring a tilt angle based on electronic textile, comprising:
    a plurality of textile electrodes disposed at predetermined uniform intervals on a textile surface;
    a textile conductive wire of which one end is connected to a center between the plurality of textile electrodes;
    a metal bead connected to another end of the textile conductive wire to thereby be connected to the textile surface and suspended at a distance from the textile surface; and
    a measurement means to calculate a tilt angle of the metal bead relative to a plane including at least one of the plurality of textile electrodes
    wherein the measurement means calculates the tilt angle of the metal bead using capacitance between each of the two different textile electrodes and the metal bead, and
    wherein the measurement means measures capacitance of each of the two conductive wires that constitute the textile conductive wire and thereby determines a difference in the measured capacitance between the two conductive wires as capacitance between the textile electrode and the metal bead.

2. The sensor of claim 1, wherein the plurality of textile electrodes is disposed to be mutually point symmetric based on a point on the textile surface at which the metal bead is connected.

3. The sensor of claim 1, wherein the plurality of textile electrodes is disposed to be at least four so that the number of the plurality of textile electrodes is a multiple of "two".

4. The sensor of claim 1, wherein the textile conductive wire is formed as a twisted pair cable, one conductive wire constituting the twisted pair cable is connected to the metal bead, and the other conductive wire is connected to a point on the textile surface at which the metal bead is connected.

5. The sensor of claim 4, wherein the twisted pair cable is wound so that the other conductive wire is not overlapped with the one conductive wire based on the one conductive wire.

6. The sensor of claim 1, wherein each of the two different textile electrodes is disposed to be mutually symmetrical among the plurality of textile electrodes.

7. The sensor of claim 6, wherein the measurement means measures the capacitance between each of the two different textile electrodes, disposed to be mutually symmetrical among the plurality of textile electrodes, and the metal bead, and calculates a tilt angle of the metal bead with respect to the two different textile electrodes using the measured capacitance.

8. The sensor of claim 7, wherein when tilt angles of the metal bead with respect to all of the plurality of textile electrodes are calculated, the measurement means calculates a relative tilt angle of the metal bead with respect to the textile surface using the calculated tilt angles of the metal bead.

9. A method of measuring a tilt angle based on electronic textile using a sensor comprising a plurality textile electrodes disposed on a textile surface and a metal bead connected to a center between the plurality of textile electrodes through a textile conductive wire, the method comprising:

measuring capacitance between each of the two different textile electrodes, disposed to be mutually symmetric among the plurality of textile electrodes, and the metal bead;

calculating a tilt angle of the metal bead with respect to the two different textile electrodes and using the measured capacitance; and calculating a relative tilt angle of the metal bead with respect to the textile surface using the tilt angles of the metal bead calculated with respect to all of the pluralty of textile electrodes.

10. The method of claim 9, wherein the plurality of textile electrodes is disposed to be mutually point symmetric based on a point on the textile surface at which the metal bead is connected.

11. The method of claim 9, wherein the plurality of textile electrodes is disposed to be at least four so that the number of the plurality of textile electrodes is a multiple of "two".

12. The method of claim 9, wherein the textile conductive wire is formed as a twisted pair cable, one conductive wire constituting the twisted pair cable is connected to the metal bead, and the other conductive wire is connected to a point on the textile surface at which the metal bead is connected.

13. The method of claim 12, wherein the twisted pair cable is wound so that the other conductive wire is not overlapped with the one conductive wire based on the one conductive wire.

* * * * *